US011201533B2

United States Patent
Beltman (10) Patent No.: US 11,201,533 B2
(45) Date of Patent: Dec. 14, 2021

(54) PLANAR POSITIONING DEVICE

(71) Applicant: C.C.M. Beheer B.V., Nuenen (NL)

(72) Inventor: Arend-Jan Johan Beltman, Best (NL)

(73) Assignee: C.C.M. Beheer B.V., Nuenen (NL)

( * ) Notice: Subject to any disclaimer, the term of this patent is extended or adjusted under 35 U.S.C. 154(b) by 54 days.

(21) Appl. No.: 16/477,662

(22) PCT Filed: Jan. 29, 2018

(86) PCT No.: PCT/NL2018/050058
§ 371 (c)(1),
(2) Date: Jul. 12, 2019

(87) PCT Pub. No.: WO2018/143795
PCT Pub. Date: Aug. 9, 2018

(65) Prior Publication Data
US 2019/0363624 A1 Nov. 28, 2019

(30) Foreign Application Priority Data
Jan. 31, 2017 (NL) ..................................... 2018266

(51) Int. Cl.
*H02K 41/03* (2006.01)
*H02K 11/21* (2016.01)
*H01L 21/68* (2006.01)

(52) U.S. Cl.
CPC ............. *H02K 41/03* (2013.01); *H01L 21/68* (2013.01); *H02K 11/21* (2016.01); *H02K 2201/18* (2013.01)

(58) Field of Classification Search
CPC .... H01L 21/68; H02K 11/21; H02K 2201/18; H02K 41/03; H02K 41/031

(Continued)

(56) References Cited

U.S. PATENT DOCUMENTS 5,760,564 A * 6/1998 Novak ................ G03F 7/70716
318/687
6,208,045 B1 3/2001 Hazelton et al.
(Continued)

FOREIGN PATENT DOCUMENTS

CN 1606822 A 4/2005
CN 1625028 A 6/2005
(Continued)

OTHER PUBLICATIONS

Chinese Patent Application No. 201880009255.0, Chinese Office Action, dated Dec. 3, 2020, 9 Pages.

*Primary Examiner* — Alex W Mok
(74) *Attorney, Agent, or Firm* — Hoffmann & Baron, LLP (57) ABSTRACT

A planar positioning device having three degrees of freedom (X, Y, $R_z$) includes a static base having a flat bearing surface and a moveable stage. The stage is moveable over the bearing surface in an XY-plane. The moveable stage includes air bearings and is supported without contact by the bearing surface via said air bearings. The device includes a linear motor acting in the X-direction and a linear motor acting in the Y-direction, and at least one additional linear motor acting in the X-direction or in the Y-direction. Each of the linear motors includes a magnet assembly arranged on the moveable stage and a coil assembly arranged on the base. The base includes a slider track extending in the X-direction and a slider track extending in the Y-direction. The sliders each have a reluctance actuator arranged on it to cooperate with (ferro)magnetic material on the moveable stage.

18 Claims, 5 Drawing Sheets

(58) Field of Classification Search
USPC .................................................. 310/12.06
See application file for complete search history.

(56) References Cited

U.S. PATENT DOCUMENTS

| | | | | |
|---|---|---|---|---|
| 6,437,463 | B1* | 8/2002 | Hazelton | G03F 7/70716 |
| | | | | 310/12.06 |
| 6,750,625 | B2* | 6/2004 | Binnard | G03F 7/70716 |
| | | | | 318/568.17 |
| 2001/0054851 | A1* | 12/2001 | Tsuboi | H02K 41/031 |
| | | | | 310/12.19 |
| 2002/0050804 | A1 | 5/2002 | Joong et al. | |
| 2003/0034695 | A1* | 2/2003 | Binnard | G03F 7/70716 |
| | | | | 310/12.06 |
| 2004/0012768 | A1* | 1/2004 | Tanaka | G03F 7/70708 |
| | | | | 355/72 |
| 2004/0263108 | A1* | 12/2004 | Lim | B23Q 1/621 |
| | | | | 318/640 |
| 2005/0116548 | A1 | 6/2005 | Oisugi et al. | |
| 2007/0018604 | A1* | 1/2007 | Montesanti | H02K 37/02 |
| | | | | 318/687 |
| 2007/0069666 | A1* | 3/2007 | Van Eijk | H01J 37/20 |
| | | | | 318/135 |
| 2007/0096567 | A1 | 5/2007 | Miyamoto et al. | |
| 2008/0196631 | A1 | 8/2008 | Kosmowski et al. | |
| 2009/0161238 | A1* | 6/2009 | Kosmowski | G02B 7/08 |
| | | | | 359/823 |
| 2010/0164305 | A1 | 7/2010 | Frankel | |
| 2017/0300135 | A1 | 10/2017 | Hisatsugu et al. | |

FOREIGN PATENT DOCUMENTS

| | | |
|---|---|---|
| CN | 1965460 A | 5/2007 |
| CN | 101286368 A | 10/2008 |
| CN | 102066038 A | 5/2011 |
| CN | 102272914 A | 12/2011 |
| CN | 204205909 U | 3/2015 |
| CN | 105339873 A | 2/2016 |
| DE | 146525 A1 | 2/1981 |
| DE | 100 54 376 A1 | 6/2001 |
| DE | 10 2007 037 886 A1 | 2/2009 |
| EP | 1 330 864 A2 | 7/2003 |
| JP | S-6288528 A | 4/1987 |
| JP | S-63235218 A | 9/1988 |

* cited by examiner

PLANAR POSITIONING DEVICE

CROSS-REFERENCE TO RELATED APPLICATIONS

This application is the National Stage of International Application No. PCT/NL2018/050058, filed Jan. 29, 2018, which claims the benefit of Netherlands Application No. 2018266 (NL), filed Jan. 31, 2017, the contents of which is incorporated by reference herein.

FIELD OF THE INVENTION

The invention relates to a planar positioning device having three degrees of freedom (X, Y, $R_z$) comprising:
a static base having a flat bearing surface; and
a moveable stage, being moveable over the bearing surface of the base in an XY-plane parallel to the bearing surface by electromagnetic driving means, wherein the XY-plane is defined by orthogonal directions X and Y, and the moveable stage including air bearings and being supported without contact by the bearing surface of the base via said air bearings.

BACKGROUND OF THE INVENTION

A positioning device is known from DE 100 54 376. This known device has a base on which at least eight elongate electrical coils are fixed. The elongate shape is necessary for providing a stroke with sufficient length to the moveable stage. Said elongate coils cooperate with at least eight permanent magnetic yokes mounted on the moveable stage. The stage is moved by selectively operating the elongate coils with an electric current. By feeding an electric current to the coils a magnetic field is generated that is used to induce the force to move the stage. Because in this known device the coils are elongate they require a large current intensity, which causes a large heat generation in the coils. The generated heat dissipates towards the surrounding parts of the device. The heat dissipation can have a negative influence on the performance of the device, due to thermal behaviour of the parts of the device.

A precision positioning device for positioning a stage in which shorter coils are used is disclosed in DE 10 2007 037 886. This known device has respective electrical driving coil pairs for moving the stage in the X-direction and Y-direction, respectively. The coil pair for driving the stage in the X-direction is movable with respect to the base in the Y-direction and the coil pair for driving the stage in the Y-direction is movable with respect to the base in the X-direction. In one embodiment disclosed in DE 10 2007 037 886 the coil pairs follow the movement of the stage by a pin or bolt fixed to the respective coil pair which pin or bolt is guided in a groove, a rail or slotted hole arranged on or in the movable stage. This solution has the disadvantage that the mechanical contact between the pin or bolt and the guiding groove or the like, which creates disturbances in the positioning of the moveable stage. In an alternative embodiment disclosed in DE 10 2007 037 886 the force to move the coil pairs with the stage is provided by a separate drive which receives control data from a higher level control system of the precision drive of the stage. This solution has the disadvantage that it needs a complex control and drive structure.

The invention has for an object to provide a dynamical accurate positioning device having three degrees of freedom, which has an alternative means to move the coil assemblies with the stage.

This object is achieved by a planar positioning device according to the invention.

SUMMARY OF THE INVENTION

The invention relates to a planar positioning device having three degrees of freedom (X, Y, $R_z$) comprising:
a static base having a flat bearing surface; and
a moveable stage, being moveable over the bearing surface of the base in an XY-plane parallel to the bearing surface by electromagnetic driving means, wherein the XY-plane is defined by orthogonal directions X and Y, and the moveable stage including air bearings and being supported without contact by the bearing surface of the base via said air bearings;
wherein:
the electromagnetic driving means comprise a linear motor acting in the X-direction and a linear motor acting in the Y-direction, and at least one additional linear motor acting in the X-direction or in the Y-direction,
each of said linear motors includes a magnet assembly arranged on the moveable stage and a coil assembly that is arranged on the base, and
the base includes a slider track extending in the X-direction and a slider track extending in the Y-direction, wherein the coil assembly of the linear motor(s) acting in the X-direction is arranged on a slider which is moveable along the slider track extending in the Y-direction and is coupled to the stage in the Y-direction, and the coil assembly of the linear motor(s) acting in the Y-direction is arranged on a slider which is moveable along the slider track extending in the X-direction and is coupled to the stage in the X-direction; and
wherein the sliders each have a reluctance actuator arranged on it, which reluctance actuator is configured and arranged to cooperate with (ferro)magnetic material on the moveable stage such that the slider follows the movement of the stage.

A linear motor consists in general of two assemblies: a coil assembly and a magnet assembly comprising permanent magnets. An electric current flowing through the coil interacting with a magnetic flux field, generated by the magnet assembly, produces a force. With this structure of the positioning device according to the invention, the moveable stage can be moved in two orthogonal directions X and Y. Furthermore, because the device according to the invention has two parallel linear motors acting in at least one of the directions X and Y, the stage can be rotated over a small angle (up to about 2 mrad) around an axis Z orthogonal to the plane defined by X and Y. This rotation $R_z$ can be brought about by operating the two linear motors acting in the same direction X or Y in a mutually reverse direction. The small rotation can be used to correct for errors in the alignment of an object held on the stage that has to be processed, e.g. a substrate or wafer.

According to the invention the coil assembly or coil assemblies that provide the force in the X-direction to move the stage in the X-direction are able to follow the stage when it moves in the Y-direction, because said coil assembly is arranged on a slider that is moveable along the slider track extending in the Y-direction. The slider is thereto coupled to the moveable stage in the Y-direction. Thus the coil assembly or coil assemblies for the X-direction maintain associated with the corresponding permanent magnet assembly or assemblies. In the same way, the coil assembly or coil assemblies that provide the force in the Y-direction to move the stage in the Y-direction are able to follow the stage when it moves in the X-direction, because said coil assembly is arranged on a slider that is moveable along the slider track extending in the X-direction. The slider is coupled to the moveable stage in the X-direction. Thus the coil assembly or coil assemblies for the Y-direction maintain associated with the corresponding magnet assembly or assemblies.

According to the invention the sliders each have a reluctance actuator arranged on it, which reluctance actuator is configured and arranged to cooperate with (ferro)magnetic material on the moveable stage so as to couple the slider to the moveable stage such that the slider follows the movement of the stage. By means of the reluctance actuator the slider is coupled to the moveable stage in a contactless manner. This is in particular advantageous in positioning systems for high-precision purposes, such as for example in positioning system in the semi-conductor industry, because the contactless coupling of the stage and the sliders avoids disturbances in the positioning of the moveable stage.

In practise the reluctance actuator comprises a core and a coil, and is used to control a gap between the core and the stage, which contains (ferro)magnetic material. A current through the coil generates a magnetic field which induces an actuator force by which the slider can be positioned with respect to the stage. The actuator force depends on the gap between the reluctance actuator and the stage and on the current through the coil. In a possible embodiment a position sensor is arranged at the reluctance actuator which measures the gap between the reluctance actuator and the stage. Thereby the non-linear relation between the coil-current and the actuation force can be compensated. Optionally a Hall-sensor can be integrated into a further embodiment to compensate for magnetic hysteresis effects.

The linear motors that can be used in the structure according to the invention are commercially available components which can be bought off the shelf. Such components are made in large quantities and therefore profit from the economy of scale. The invention thus provides positioning device with a dynamical submicron motion accuracy, which is much more cost-effective than the positioning device known from DE 100 54 376.

In a preferred embodiment the positioning device has per direction X and Y, respectively, a pair of linear motors, a pair of sliders and a pair of slider tracks. In this way a sufficient and well balanced driving force can be provided to the stage for all directions of movement.

In further embodiment the sliders of the coil assemblies of the linear motors of said pair are mechanically coupled such that they move together along their corresponding slider track. Thus the coil assemblies of the first linear motors move together, and the coil assemblies of the second linear motors move together.

Another possibility is that the slider is mechanically coupled to the stage such that it follows the stage in one direction (X, Y) and allows movement of the stage relative to the slider in the orthogonal direction (Y, X). For high precision purposes such a mechanic solution might be less suitable, because mechanic contact and coupling and decoupling may cause disturbances. However, it is conceivable that there are practical uses for the positioning system in which this is less relevant and a mechanic coupling is feasible.

Also a hybrid between reluctance actuators and a mechanical coupling is conceivable, in which the reluctance actuator couples the stage to the slider when it moves in one direction (e.g. X+), and in which a mechanical member couples the slider to the stage (catches the stage) when it moves in the opposite direction (e.g. X−).

In a possible embodiment the sliders have bearings, preferably roller bearings, to support them on the slider tracks. It is however also conceivable to use or type of bearings.

In a possible embodiment the positioning device comprises linear encoders to determine the X and Y coordinates of the stage. The linear encoder components are standard components that can be bought off the shelf. This makes it relatively cost saving.

In a preferred embodiment the positioning device comprises at least three linear encoders, wherein the stage is provided with a linear encoder scale extending in the X-direction and one of the sliders moveable in the Y-direction is provided with a corresponding encoder head, configured and arranged to cooperate with the encoder scale to determine the position of the stage in the X-direction, wherein the moveable stage is provided with a linear encoder scale extending in the Y-direction and one of the sliders moveable in the X-direction is provided with a corresponding encoder head, configured and arranged to cooperate with the encoder scale to determine the position of the stage in the Y-direction, and wherein the stage is provided with at least a third linear encoder scale extending in the X-direction or the Y-direction and one of the sliders moveable in the Y-direction or X-direction is provided with a corresponding encoder head, configured and arranged to cooperate with the encoder scale to determine the position of the stage in the X-direction or the Y-direction.

By means of at least three linear encoders, i.e. two in the X- or Y-direction and at least one in the orthogonal direction Y or X, allows for measurement of the three degrees of freedom of the stage (X, Y, $R_z$), i.e. the X and Y coordinates of the stage and the angle of rotation $R_z$ around the Z-axis.

Furthermore, the use of at least three linear encoders provides measurements which can be combined and this will approximate the minimal measurement error according to the Abbe principle with relatively cheap components.

In a preferred embodiment the positioning device includes four linear encoders, wherein the stage is provided with two linear encoder scales extending in the X-direction and the sliders moveable in the Y-direction are provided with corresponding encoder heads, configured and arranged to cooperate with the respective encoder scales, and wherein the moveable stage is provided with two linear encoder scales extending in the Y-direction and the sliders moveable in the X-direction are provided with corresponding encoder heads, configured and arranged to cooperate with the respective encoder scales.

In the positioning device according to the invention it is also possible to use another measurement concept. An alternative measurement system may for example be a system comprising a grid plate or chequered plate arranged on an underside of the moveable stage, and a sensor assembly arranged in the centre of the base which includes optical sensors to measure the three degrees of freedom (X, Y, $R_z$) of the stage. Such a measuring system is for example known from DE 100 54 376. It provides more accurate measurements (minimal Abbe error), but is also more expensive than the solution with the linear encoders mentioned in the above.

In a possible embodiment the moveable stage has a rectangular, preferably square, configuration, wherein the air bearings are arranged on the corners of said rectangular, preferably square, configuration.

In a further embodiment the respective magnet assemblies of the linear motors associated with the X-movement and the Y-movement, respectively, are arranged at perpendicular sides of the rectangular, preferably square, configuration of the moveable stage.

In an already mentioned embodiment the positioning device has per direction X and Y, respectively, a pair of linear motors and a pair of slider tracks. In this embodiment there are thus four linear motors, i.e. two linear motors associated with the X-movement and two linear motors associated with the Y-movement. In an embodiment in which the moveable stage has a rectangular, preferably square, configuration, the linear motors associated with the X-movement are arranged at opposite sides of the rectangle or square and the linear motors associated with the Y-movement are arranged at opposite sides of the rectangle or square.

In a possible embodiment the slider tracks and the sliders with coil assemblies are arranged recessed with respect to the upper surface of the base in a gap, such that the coil assemblies do not extend beyond the upper surface. By this a structure with a low structure height is provided. The latter contributes to a more exact relation between measurement system and position of the centre of the stage, where an object is held to be processed.

In a possible embodiment the base comprises one or more stone slabs, preferably granite slabs, that define the upper surface. Stone slabs, and in particular granite slabs can be accurately processed to be provided with flat surfaces and the desired peripheral shape, wherein in particular a square shape is desired.

In a preferred embodiment the base comprises four rectangular stone slabs which are arranged with a crosswise spacing between them, wherein said spacing forms said gaps.

Preferably, each of the air bearings is associated with one of the stone slabs, such that each stone slab supports only one air bearing.

In further embodiment, the sliders each may have air bearings that are directed to the peripheral sides of the rectangular stone slabs that define the sides of the gaps. Preferably the air bearings are biased by a spring that forces them towards the corresponding side of the stone slab. This air bearing structure provides a frictionless guiding of the slider in the gap.

In a practical embodiment at least one ferromagnetic element is incorporated in the static base, said ferromagnetic element attracting one or more permanent magnets of the moveable stage, thereby biasing the air bearings of the moveable stage. Advantageously, the permanent magnets of the moveable stage are the permanent magnets in the magnet assemblies of the linear motors.

In a possible further embodiment, the base comprises a steel plate that constitutes the ferromagnetic element, which is, preferably, located underneath the level of the upper surface. In case the upper surface is defined by stone slabs, the steel plate is arranged underneath the slabs.

The positioning device according to the invention is in use connected to a control unit, which is configured to perform position control of the moveable stage. Thereto the control unit is connected to the device to receive measurement signals from the sensors and to send control signals to the linear motors.

The invention will be more elucidated in the following description of a preferred embodiment with reference to the drawings.

DETAILED DESCRIPTION OF THE INVENTION

Figure 1:
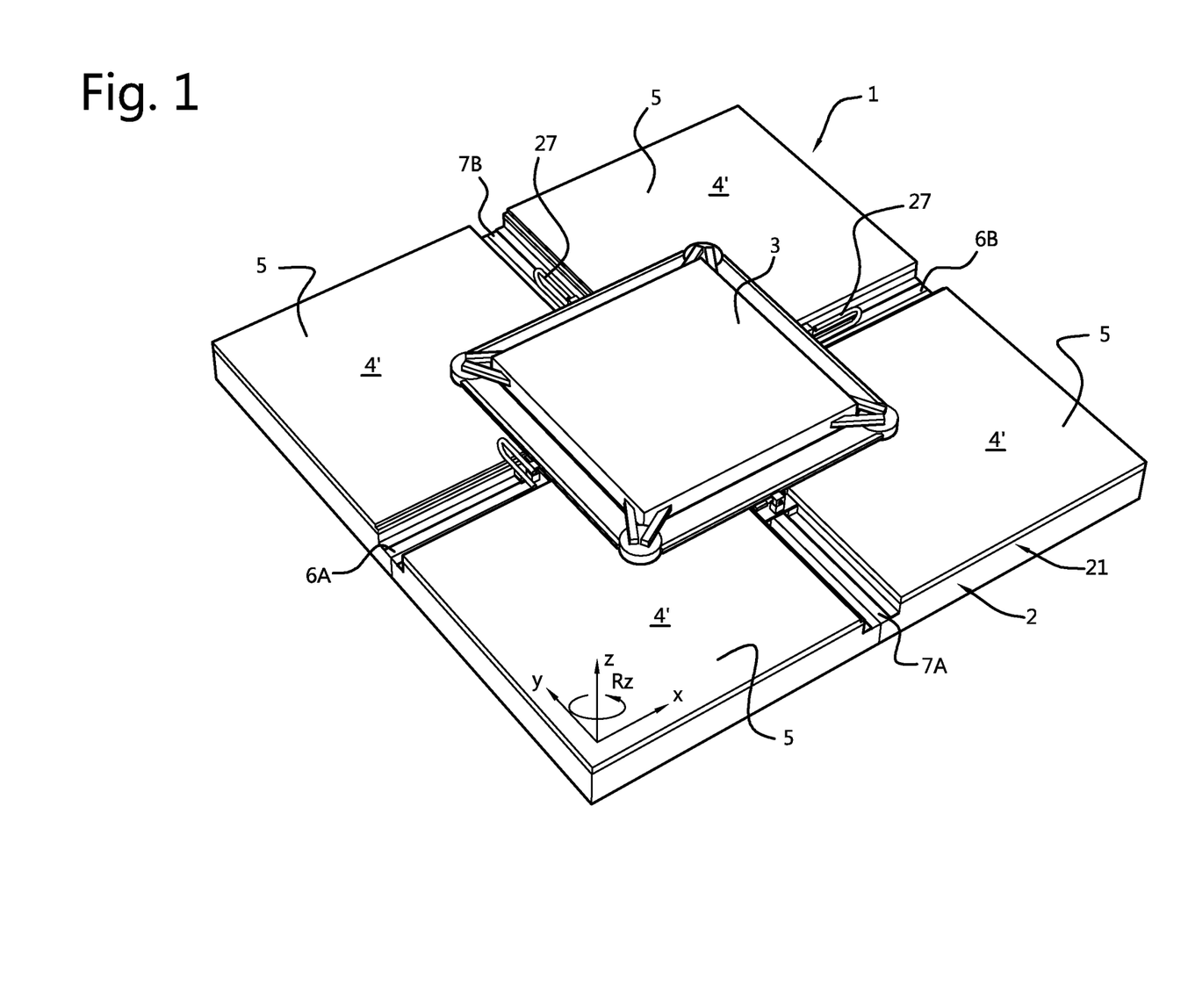
FIG. 1 shows schematically an embodiment of a positioning device according to the invention.

In FIG. 1 is shown a positioning device 1 which for example may be used to position substrates that have to be processed by a processing unit, e.g. in the semi-conductor industry.

The positioning device 1 comprises a base 2 and a movable stage 3 that is adapted to support and hold the substrate.

The base 2 comprises four flat bearing surface portions 4'. The four bearing surface portions 4' are constituted by four stone slabs 5. The slabs 5 have a square shape and are positioned in a square configuration, whereby the base 2 in general has a square configuration. The upper surfaces 4' of the four stone slabs 5 define together the flat bearing surface 4 of the base 2.

In a practical embodiment the stone slabs 5 are granite slabs, which are accurately processed to be provided with flat surfaces, straight edges and orthogonal sides.

The slabs 5 are positioned on a mutual distance from each other, such that gaps 6A, 6B and 7A, 7B are provided between the slabs 5. The width of the gaps 6A, 6B, 7A, 7B is the same. The gaps 6A, 6B and 7A, 7B extend perpendicularly to each other and together form a cross. The centre of the cross is located in the centre 2' of the base 2.

Figure 3:
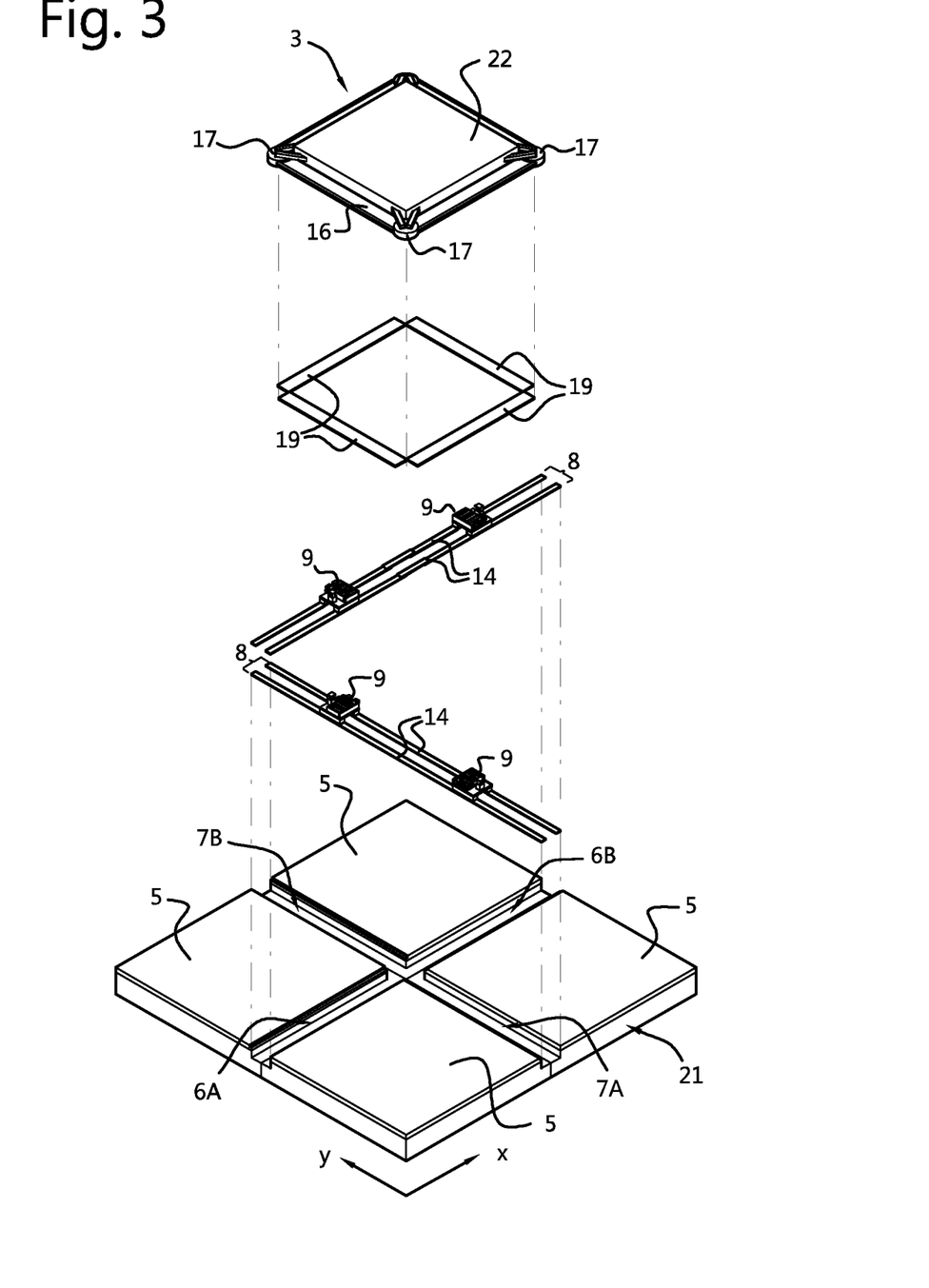
FIG. 3 shows another exploded view of a similar positioning device.
Figure 4:
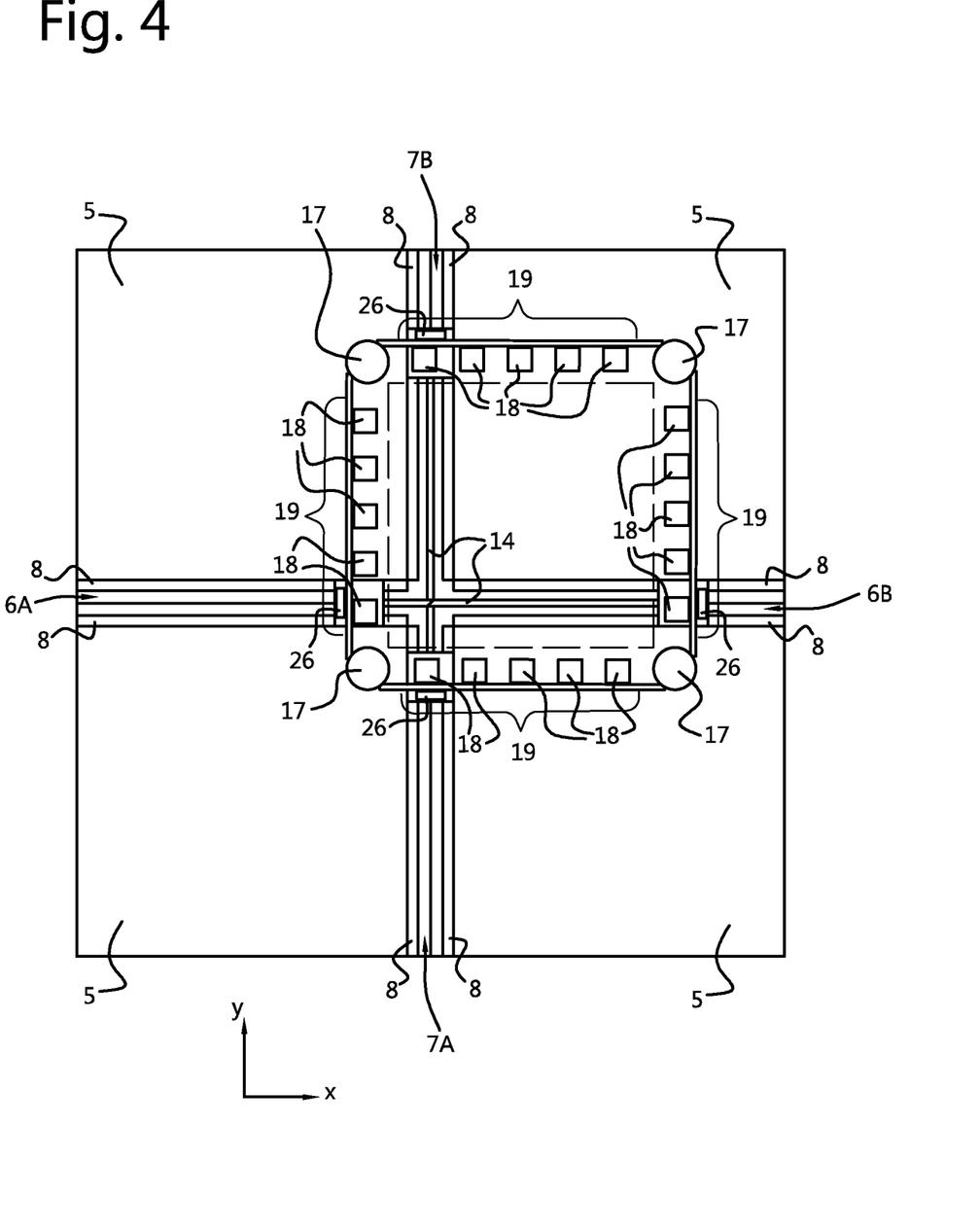
FIG. 4 shows a schematic top elevational view of the positioning device of FIG. 3.

In the gaps 6A, 6B, 7A, 7B slider tracks 8 are arranged. And on the slider tracks 8 a slider 9 is placed in each gap, which is moveable back and forth along the slider track 8. The slider track 8 may comprise a sort of track rails 8' as is indicated in FIGS. 3 and 4. Possibly roller bearings are provided between the slider 9 and the slider track 8 such that the slider 9 is guided along the slider track 8.

Figure 2:
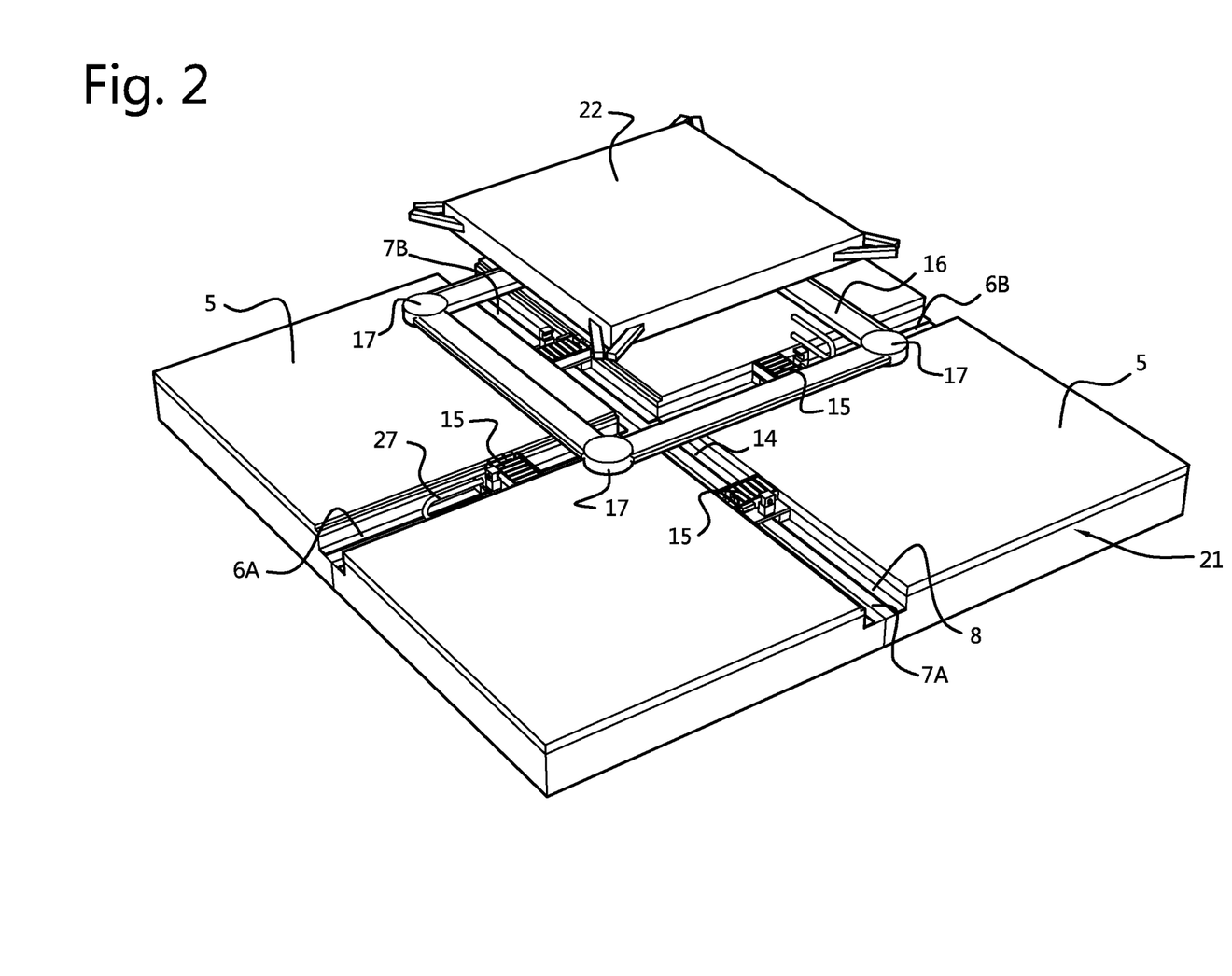
FIG. 2 shows an exploded view of the positioning device of FIG. 1.
Figure 2A:
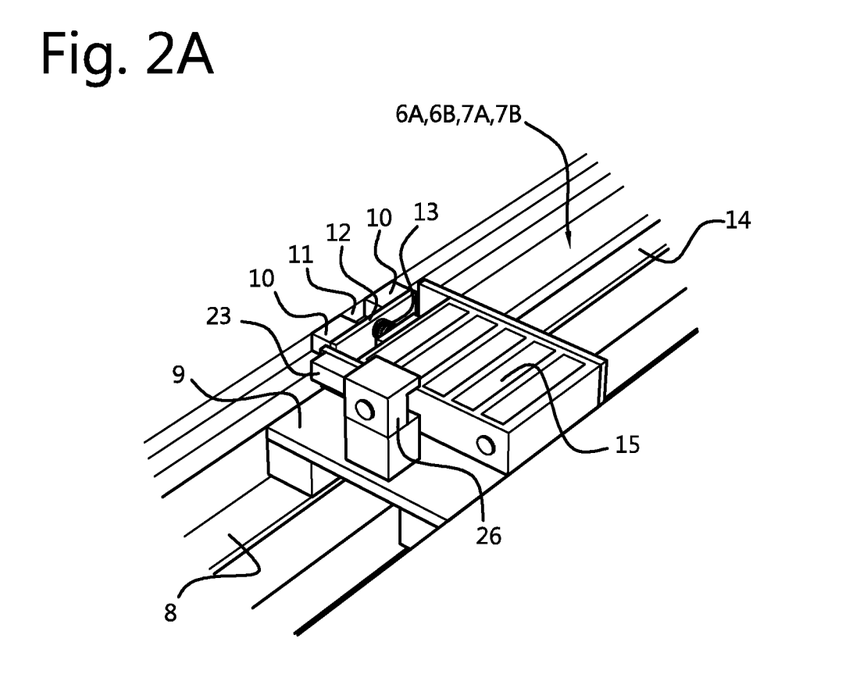
FIG. 2A shows a slider with a coil assembly of the device of FIG. 1.

Air bearings 10 are provided between the slider 9 and one of the side surfaces 11 of the slabs 5 that define the gap 6A, 6B, 7A, 7B between them. In FIG. 2A is visible that two air bearings 10 are mounted on a front of a carrying plate 12. A spring 13 is operationally connected with the back of the carrying plate 12 and biases the carrying plate 12 and the air bearings 10 towards the side surface 11. The accurately manufactured side surface 11 of the stone slab 5 thus guides the slider 9.

The sliders 9 that are located in two gaps 6A, 6B or 7A, 7B that are in line with each other are mechanically coupled by connection members 14. The coupled sliders 9 thus form one unit 15 (see FIG. 3) and move together along their respective corresponding slider track 6A and 6B, respectively or 7A and 7B, respectively.

On each one of the sliders 9 a coil assembly 15 is mounted. The coil assembly 15 is operable with an electric current and forms one part of a linear motor as will be described further below.

The sliders 9 and the components mounted on the sliders 9 are connected to cables for electrical power and signal information and supply lines for pneumatic power. Via a single cable schlepp 27 for each pair of sliders, these cables and supply lines are lead to one of the sliders 9 of the pair.

The connection members 14 can be hollow tubes or hollow profile elements, through which the power lines, signal cables and supply lines for pneumatic pressure can pass, such that electrical power, pneumatic power and signals can be transferred to the other slider 9 of the pair and its components not having the cable schlepp 27 directly connected to it.

The moveable stage 3 has a substantially rectangular shape, in particular it has a square contour. In a possible embodiment the moveable stage 3 comprises a substantially rectangular frame 16, more in particular a square frame 16. Air bearings 17 are provided at the corners of the rectangular frame 16.

On top of the frame 16 a chuck 22 is arranged for carrying and holding a substrate or other object to be processed.

The moveable stage 3 is supported without contact by the bearing surface 4 of the base 2 via the air bearings 17.

Figure 2B:
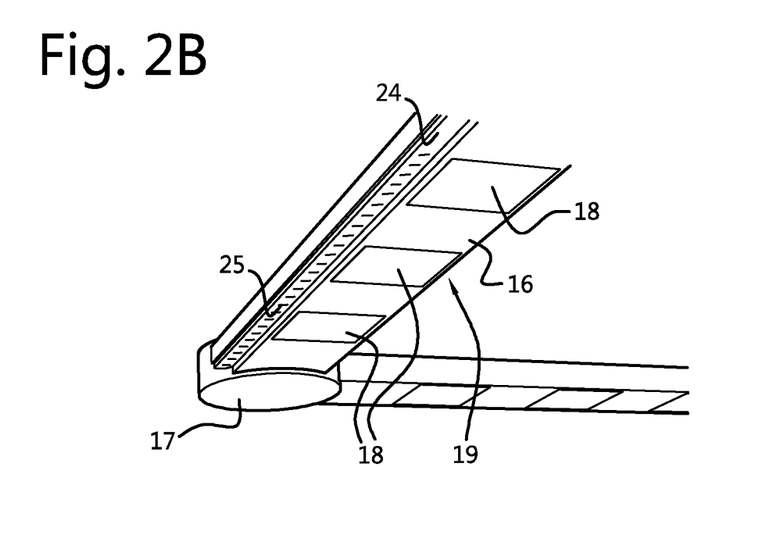
FIG. 2B shows a view in perspective from below of a part of a moveable stage of the device of FIG. 1.

At an underside of the sides of the frame 16 a series of permanent magnets 18 is arranged which have alternately opposite polarity. The series of magnets 18 form a magnet assembly 19 which in combination with an associated coil assembly 15 form a linear motor 20 which are used for driving the moveable stage 3.

The linear motor 20, like linear motors in general, consists in general of two assemblies: a coil assembly and a magnet assembly comprising permanent magnets. A typical magnet assembly comprises a series of permanent bar magnets arranged in a row on a carrier. The bar magnets in the row have alternating polarities. The coil assembly 15 typically comprises one or more (iron core) coils. An electric current flowing through the coil interacting with a magnetic flux field, generated by the magnet assembly 19, produces a driving force of the linear motor.

The permanent magnets 18 also have another function, which is that they are used to bias the air bearings 17. To this end the base 2 includes a ferromagnetic element, in this case a steel plate 21, which is arranged under the stone slabs 5 and which attracts the permanent magnets of the moveable stage 3. Thereby the air bearings 17, which provide a repelling force, are biased or in other words are given a pretension.

The slider tracks 8 and the sliders 9 with coil assemblies 15 are arranged recessed with respect to the bearing surface 4 of the base 2 in a gap 6A, 6B, 7A, 7B, such that the coil assemblies 15 do not extend beyond the bearing surface 4.

At least one of the sliders 9 moveable in the X-direction, i.e. along the gaps 6A, 6B is provided with an encoder head 23. At the corresponding side 31 of the moveable stage 3 a ruler 24 is mounted which includes a linear encoder scale 25. The linear encoder scale 25 is configured and arranged to cooperate with the encoder head 23 to determine the position of the moveable stage in the Y-direction, i.e. in the direction along the gaps 7A, 7B. Furthermore, in a corresponding way, at least one of the sliders 9 moveable in the Y-direction is provided with an encoder head 23. The corresponding side 32 of the moveable stage 3 is provided with a ruler 24 which includes a linear encoder scale 25 configured and arranged to cooperate with the encoder head 23 to determine the position of the stage 3 in the X-direction.

The sliders 9 each have a reluctance actuator 26 arranged on it, which reluctance actuator 26 is configured and arranged to cooperate with (ferro)magnetic material on the moveable stage 3 such that the slider 9 follows the movement of the stage 3.

By means of the reluctance actuator 26 the slider 9 is coupled to the moveable stage in a contactless manner. The contactless coupling of the stage and the sliders avoids disturbances in the positioning of the moveable stage. This is in particular advantageous in positioning systems for high-precision purposes.

The reluctance actuator 26 comprises a core and a coil, and is used to control a gap distance between the core and a component including (ferro)magnetic material, in this case the moveable stage 3. An electrical current through the coil generates a magnetic field which results in an actuator force by which the slider 9 can be positioned with respect to the stage 3. The actuator force depends on the gap distance between the reluctance actuator 26 and the stage 3 and on the electrical current through the coil. When the stage 3 moves the reluctance actuator provides the force such that the slider is dragged along by the moving stage 3 while maintaining the gap between the actuator 26 and the stage 3. In a possible embodiment a position sensor (not shown) is arranged at the reluctance actuator 26 which measures the gap between the reluctance actuator 26 and the stage 3. Thereby the non-linear relation between the coil-current and the actuation force can be compensated.

In order to compensate for magnetic hysteresis effects a Hall-sensor may be integrated additionally.

It is conceivable to couple the sliders contactless to the stage in another way by means of alternative electromagnetic means instead of the reluctance actuators. It is even conceivable to decouple the two sliders 9 which are interconnected in the above embodiment by the members 14, if the sliders 9 can be dragged along in two directions by said alternative electromagnetic means.

Another possibility is that the slider 9 is mechanically coupled to the stage 3 such that it follows the stage 3 in one direction (X, Y) and allows movement of the stage 3 relative to the slider 9 in the orthogonal direction (Y, X). For high precision purposes such a mechanic solution might be less suitable, because mechanic contact and coupling and decoupling may cause disturbances. However, it is conceivable that there are practical uses for the positioning system in which this is less relevant and a mechanic coupling is feasible.

Also a hybrid between reluctance actuators and a mechanical coupling is conceivable, in which the reluctance actuator 26 couples the stage 3 to the slider 9 when it moves in one direction (e.g. X+), and in which a mechanical member couples the slider 9 to the stage 3 (catches the stage) when it moves in the opposite direction (e.g. X−).

The positioning device 1 can be connected to a control unit, which is configured to perform position control of the moveable stage. Thereto the control unit is connected to the device to receive measurement signals from the sensors and to send control signals to the linear motors.

The positioning device can be calibrated by arranging temporarily an optical calibration sensor in the centre of the base 2 at the crossing between the gaps 6A, 6B, 7A, 7B. On the underside of the moveable stage 3 a chequered pattern is provided which is detected by the calibration sensor. During calibration the stage 3 is moved purely in X-direction and purely in Y-direction such that the residual non-straightness and/or non-orthogonality can be detected. This information can be stored in the control unit and used it in the motion control of the stage 3 by compensating for the non-straightness and/or non-orthogonality.

Different aspects of the invention may be summarized by the following clauses:

1. A planar positioning device having three degrees of freedom (X, Y, R$_z$) comprising:
a static base having a flat bearing surface; and
a moveable stage, being moveable over the bearing surface of the base in an XY-plane parallel to the bearing surface by electromagnetic driving means, wherein the XY-plane is defined by orthogonal directions X and Y, and the moveable stage including air bearings and being supported without contact by the bearing surface of the base via said air bearings;
wherein:
the electromagnetic driving means comprise a linear motor acting in the X-direction and a linear motor acting in the Y-direction, and at least one additional linear motor acting in the X-direction or in the Y-direction,
each of said linear motors includes a magnet assembly arranged on the moveable stage and a coil assembly that is arranged on the base, and
the base includes a slider track extending in the X-direction and a slider track extending in the Y-direction, wherein the coil assembly of the linear motor(s) acting in the X-direction is arranged on a slider which is moveable along the slider track extending in the Y-direction and is coupled to the stage in the Y-direction, and the coil assembly of the linear motor(s) acting in the Y-direction is arranged on a slider which is moveable along the slider track extending in the X-direction and is coupled to the stage in the X-direction.

2. The positioning device according to clause 1, wherein the positioning device has per direction X and Y, respectively, a pair of linear motors, a pair of sliders and a pair of slider tracks.

3. The positioning device according to clause 2, wherein the sliders of the coil assemblies of the linear motors of said pair are mechanically coupled such that they move together along their corresponding slider track.

4. The positioning device according to any one of the preceding clauses, wherein the sliders each have a reluctance actuator arranged on it, which reluctance actuator is configured and arranged to cooperate with (ferro)magnetic material on the moveable stage such that the slider follows the movement of the stage.

5. The positioning device according to any one of the preceding clauses, wherein the device comprises linear encoders to determine the X and Y coordinates of the stage.

6. The positioning device according to clause 5, wherein the positioning device comprises at least three linear encoders, wherein the stage is provided with a linear encoder scale extending in the X-direction and one of the sliders moveable in the Y-direction is provided with a corresponding encoder head, configured and arranged to cooperate with the encoder scale to determine the position of the stage in the X-direction, wherein the moveable stage is provided with a linear encoder scale extending in the Y-direction and one of the sliders moveable in the X-direction is provided with a corresponding encoder head, configured and arranged to cooperate with the encoder scale to determine the position of the stage in the Y-direction, and wherein the stage is provided with at least a third linear encoder scale extending in the X-direction or the Y-direction and one of the sliders moveable in the Y-direction or X-direction is provided with a corresponding encoder head, configured and arranged to cooperate with the encoder scale to determine the position of the stage in the X-direction or the Y-direction.

7. The positing device according to clause 5, wherein the stage is provided with two linear encoder scales extending in the X-direction and the sliders moveable in the Y-direction are provided with corresponding encoder heads, configured and arranged to cooperate with the respective encoder scales, and wherein the moveable stage is provided with two linear encoder scales extending in the Y-direction and the sliders moveable in the X-direction are provided with corresponding encoder heads, configured and arranged to cooperate with the respective encoder scales.

8. The positioning device according to any one of the preceding clauses, wherein the moveable stage has a square configuration, wherein the air bearings are arranged on the corners of said square configuration.

9. The positioning device according to clause 8, wherein the respective magnet assemblies of the linear motors associated with the X-movement and the Y-movement, respectively, are arranged at perpendicular sides of the square configuration of the moveable stage.

10. The positioning device according to one of the preceding clauses, wherein the slider tracks and the sliders with coil assemblies are arranged recessed with respect to the upper surface of the base in a gap, such that the coil assemblies do not extend beyond the upper surface.

11. The positioning device according to any one of the preceding clauses, wherein the base comprises one or more stone slabs, preferably granite slabs, that define the bearing surface.

12. The positioning device according to clauses 10 and 11, wherein the base comprises four rectangular stone slabs which are arranged with a crosswise spacing between them, wherein said spacing forms said gaps.

13. The positioning device according to clauses 8 and 12, wherein each of the air bearings is associated with one of the stone slabs, such that each stone slab supports only one air bearing.

14. The positioning device according to any one of the preceding clauses, wherein at least one ferromagnetic element is incorporated in the static base, said ferromagnetic element attracting one or more permanent magnets of the moveable stage, thereby biasing the air bearings.

15. The positioning device according to clause 14, wherein the base comprises a steel plate that constitutes the ferromagnetic element.

X16. The positioning device according to clause 15, wherein the steel plate is located underneath the level of the upper surface.

17. The positioning device according to clause 12, wherein the sliders each have one or more air bearings that are directed to the peripheral sides of the rectangular stone slabs that define the sides of the gaps.

18. The positioning device according to clause 16, wherein the air bearings are biased by a spring (that forces them towards the corresponding side of the stone slab).

X19. The positioning device according to any one of the preceding clauses, wherein the sliders have bearings, preferably roller bearings, to support them on the slider tracks.

The invention claimed is:
1. A planar positioning device having three degrees of freedom (X, Y, Rz) comprising:
a static base having a flat bearing surface; and
a moveable stage, being moveable over the bearing surface of the base in an XY-plane parallel to the bearing surface by electromagnetic driving means, wherein the XY-plane is defined by orthogonal directions X and Y, and the moveable stage including air bearings and being supported without contact by the bearing surface of the base via said air bearings;

wherein:

the electromagnetic driving means comprise a linear motor acting in the X-direction and a linear motor acting in the Y-direction, and at least one additional linear motor acting in the X-direction or in the Y-direction, each of said linear motors includes a magnet assembly arranged on the moveable stage and a coil assembly that is arranged on the base, the base includes a slider track extending in the X-direction and a slider track extending in the Y-direction, wherein the coil assembly of the linear motor(s) acting in the X-direction is arranged on a slider which is moveable along the slider track extending in the Y-direction and is coupled to the stage in the Y-direction in a contactless manner by means of a reluctance actuator arranged on the slider and acting in the Y-direction in cooperation with magnetic material on the moveable stage such that the slider follows the movement of the moveable stage along the slider track extending in the Y-direction, and the coil assembly of the linear motor(s) acting in the Y-direction is arranged on a slider which is moveable along the slider track extending in the X-direction and is coupled to the stage in the X-direction in a contactless manner by means of a reluctance actuator arranged on the slider and acting in the X-direction in cooperation with magnetic material on the moveable stage such that the slider follows the movement of the moveable stage along the slider track extending in the X-direction.

2. The positioning device according to claim 1, wherein the positioning device has per direction X and Y, respectively, a pair of linear motors, a pair of sliders and a pair of slider tracks.

3. The positioning device according to claim 2, wherein the sliders of the coil assemblies of the linear motors of said pair are mechanically coupled such that they move together along their corresponding slider track.

4. The positioning device according to claim 1, wherein the device comprises linear encoders to determine the X and Y coordinates of the stage.

5. The positioning device according to claim 4, wherein the positioning device comprises at least three linear encoders, wherein the stage is provided with a linear encoder scale extending in the X-direction and one of the sliders moveable in the Y-direction is provided with a corresponding encoder head, configured and arranged to cooperate with the encoder scale to determine the position of the stage in the X-direction, wherein the moveable stage is provided with a linear encoder scale extending in the Y-direction and one of the sliders moveable in the X-direction is provided with a corresponding encoder head, configured and arranged to cooperate with the encoder scale to determine the position of the stage in the Y-direction, and wherein the stage is provided with at least a third linear encoder scale extending in the X-direction or the Y-direction and one of the sliders moveable in the Y-direction or X-direction is provided with a corresponding encoder head, configured and arranged to cooperate with the encoder scale to determine the position of the stage in the X-direction or the Y-direction.

6. The positing device according to claim 4, wherein the stage is provided with two linear encoder scales extending in the X-direction and the sliders moveable in the Y-direction are provided with corresponding encoder heads, configured and arranged to cooperate with the respective encoder scales, and wherein the moveable stage is provided with two linear encoder scales extending in the Y-direction and the sliders moveable in the X-direction are provided with corresponding encoder heads, configured and arranged to cooperate with the respective encoder scales.

7. The positioning device according to claim 1, wherein the moveable stage has a rectangular configuration, wherein the air bearings are arranged on the corners of said rectangular configuration.

8. The positioning device according to claim 1, wherein the respective magnet assemblies of the linear motors associated with the X-movement and the Y-movement, respectively, are arranged at perpendicular sides of the rectangular configuration of the moveable stage.

9. The positioning device according to claim 1, wherein the slider tracks and the sliders with coil assemblies are arranged recessed with respect to the upper surface of the base in a gap, such that the coil assemblies do not extend beyond the upper surface.

10. The positioning device according to claim 9, wherein the base comprises four rectangular stone slabs which are arranged with a crosswise spacing between them, wherein said spacing forms said gaps.

11. The positioning device according to claim 10, wherein the moveable stage has a rectangular configuration, wherein the air bearings are arranged on the corners of said rectangular configuration, and wherein each of the air bearings is associated with one of the stone slabs, such that each stone slab supports only one air bearing.

12. The positioning device according to claim 10, wherein the sliders each have one or more air bearings that are directed to the peripheral sides of the rectangular stone slabs that define the sides of the gaps.

13. The positioning device according to claim 1, wherein the base comprises one or more stone slabs that define the bearing surface.

14. The positioning device according to claim 1, wherein at least one ferromagnetic element is incorporated in the static base, said ferromagnetic element attracting one or more permanent magnets of the moveable stage, thereby biasing the air bearings.

15. The positioning device according to claim 14, wherein the base comprises a metal plate that constitutes the ferromagnetic element.

16. The positioning device according to claim 15, wherein the steel plate is located underneath the level of the upper surface.

17. The positioning device according to claim 16, wherein the air bearings are biased by a spring.

18. The positioning device according to claim 1, wherein the sliders have bearings to support them on the slider tracks.

* * * * *